(12) United States Patent
Singleton et al.

(10) Patent No.: US 9,087,535 B2
(45) Date of Patent: Jul. 21, 2015

(54) SPIN TRANSPORT SENSOR

(71) Applicant: Seagate Technology LLC, Cupertino, CA (US)

(72) Inventors: Eric Walter Singleton, Maple Plain, MN (US); Zhiguo Ge, Lakeville, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/069,015

(22) Filed: Oct. 31, 2013

(65) Prior Publication Data

US 2015/0116870 A1    Apr. 30, 2015

(51) Int. Cl.
G11B 5/33    (2006.01)
G11B 5/39    (2006.01)

(52) U.S. Cl.
CPC ............... *G11B 5/3938* (2013.01); *G11B 5/33* (2013.01)

(58) Field of Classification Search
CPC .................................. G11B 5/33; G11B 5/127
USPC ................. 360/324.1, 324.2, 324.12
See application file for complete search history.

(56) References Cited

U.S. PATENT DOCUMENTS

| | | | |
|---|---|---|---|
| 7,800,858 B1 | 9/2010 | Bajikar et al. | |
| 8,339,750 B2 | 12/2012 | Sasaki | |
| 8,411,493 B2 * | 4/2013 | Katti | 365/158 |
| 2003/0235015 A1 * | 12/2003 | Wu | 360/321 |
| 2007/0121249 A1 * | 5/2007 | Parker | 360/126 |
| 2008/0238779 A1 * | 10/2008 | Murali et al. | 343/700 MS |
| 2008/0247223 A1 * | 10/2008 | Inokuchi et al. | 365/158 |
| 2009/0015958 A1 * | 1/2009 | Nakamura et al. | 360/55 |
| 2010/0046282 A1 * | 2/2010 | Deak | 365/158 |
| 2010/0254183 A1 * | 10/2010 | Fukami et al. | 365/158 |
| 2010/0277971 A1 * | 11/2010 | Slaughter et al. | 365/158 |
| 2010/0296202 A1 | 11/2010 | Boone, Jr. et al. | |
| 2011/0007429 A1 * | 1/2011 | Dimitrov et al. | 360/319 |
| 2011/0199818 A1 * | 8/2011 | Fukami et al. | 365/171 |
| 2012/0015099 A1 * | 1/2012 | Sun et al. | 427/129 |
| 2012/0163061 A1 * | 6/2012 | Andre | 365/66 |
| 2014/0252518 A1 * | 9/2014 | Zhang et al. | 257/422 |

OTHER PUBLICATIONS

Yamada et al., "Scalability of Spin Accumulation Sensor," Japan, IEEE Transactions on Magnetics, vol. 49, No. 2, Feb. 2013, pp. 713-717.

* cited by examiner

*Primary Examiner* — Allen T Cao
(74) *Attorney, Agent, or Firm* — HolzerIPLaw, PC

(57) ABSTRACT

The implementations disclosed herein provide for a spin transport sensor including a synthetic antiferromagnet (SAF) adjacent a shield element. The SAF extends to an air-bearing surface (ABS) and provides a current path from a current source to an ABS-region of a spin conductor layer. Spin current diffuses from the spin conductor layer to an adjacent free layer, which generates a measurable electrical voltage in a free layer of the spin transport sensor. The SAF serves as both a magnetic shield and a spin injector to the spin conductor layer.

20 Claims, 13 Drawing Sheets

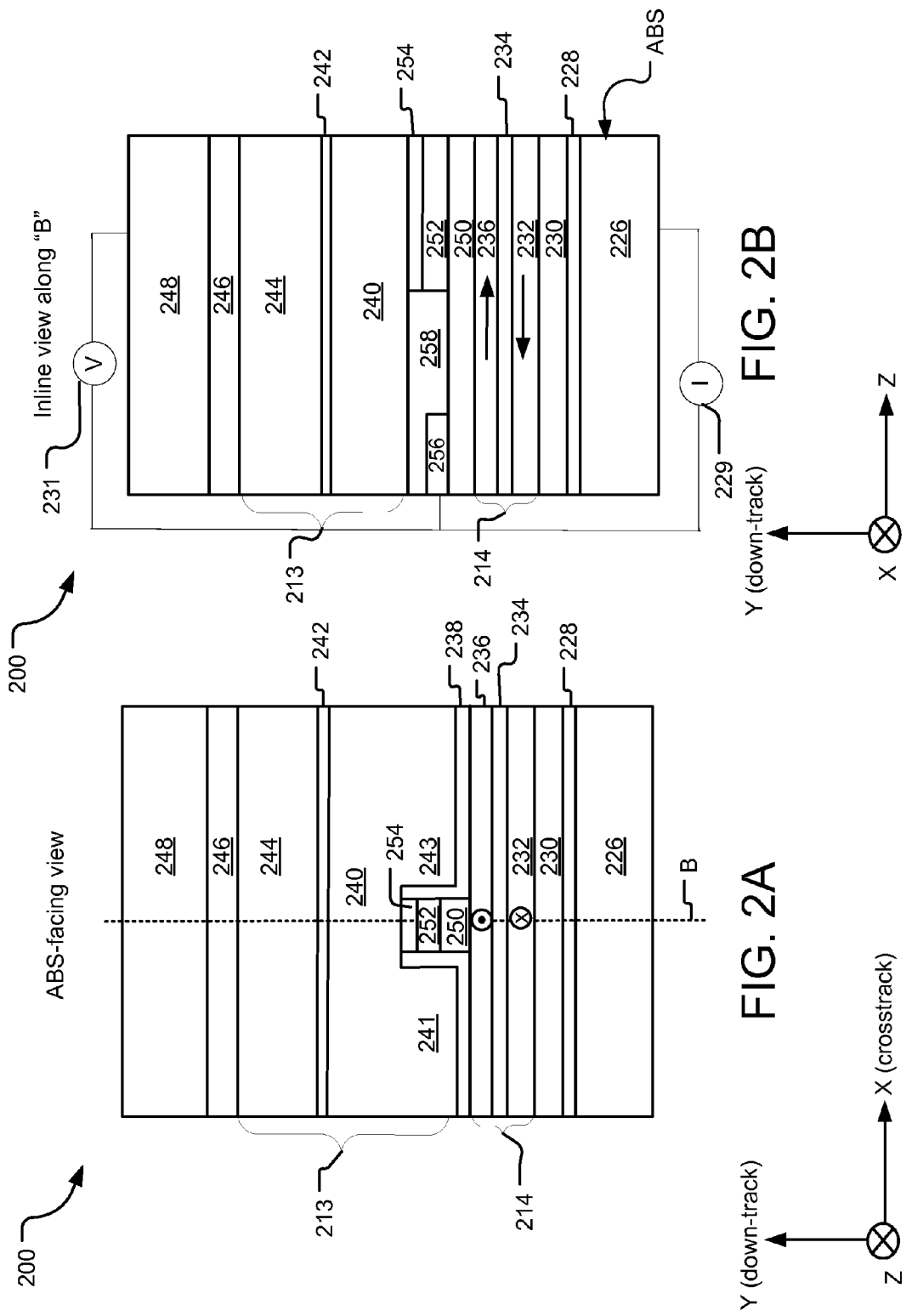

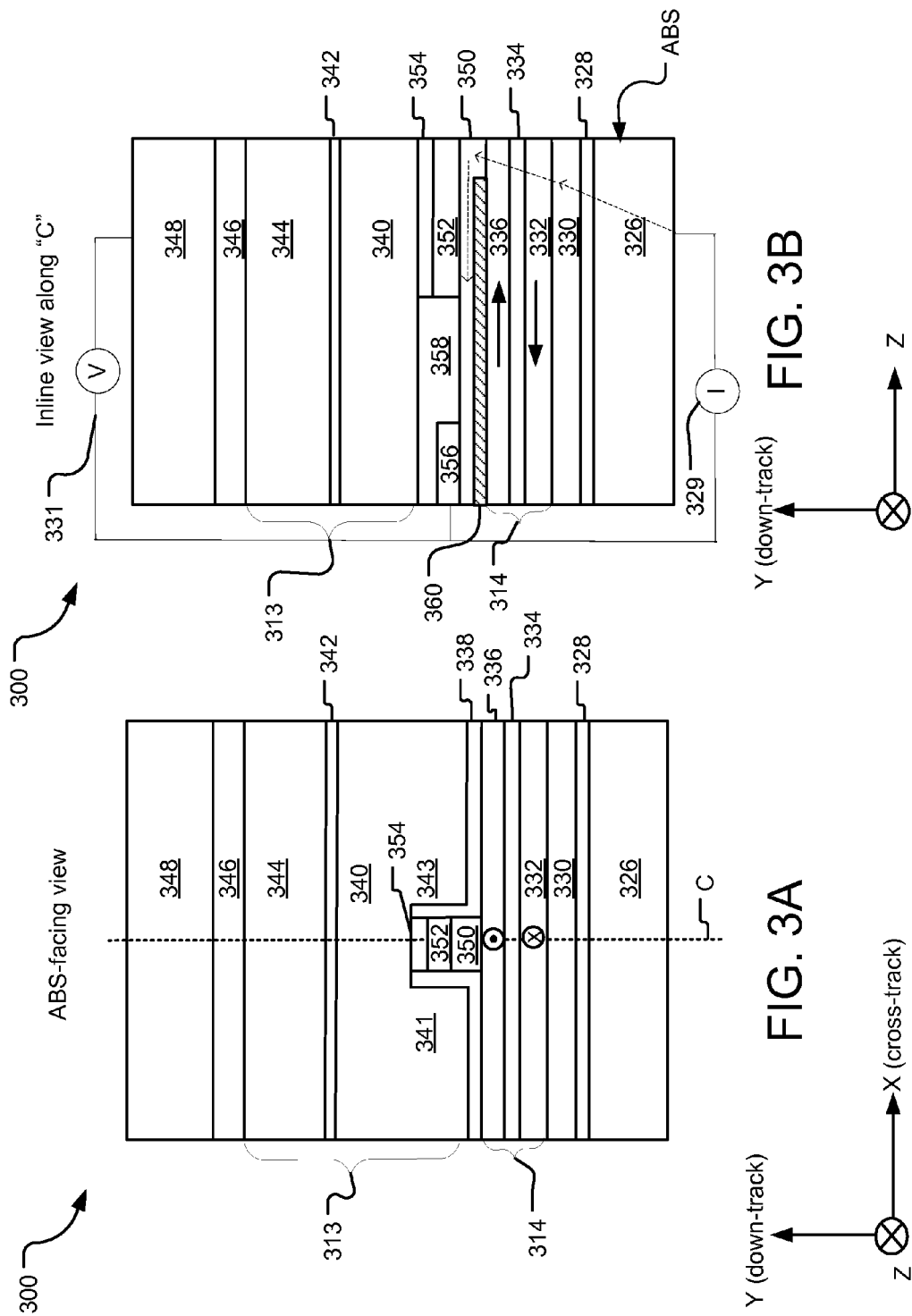

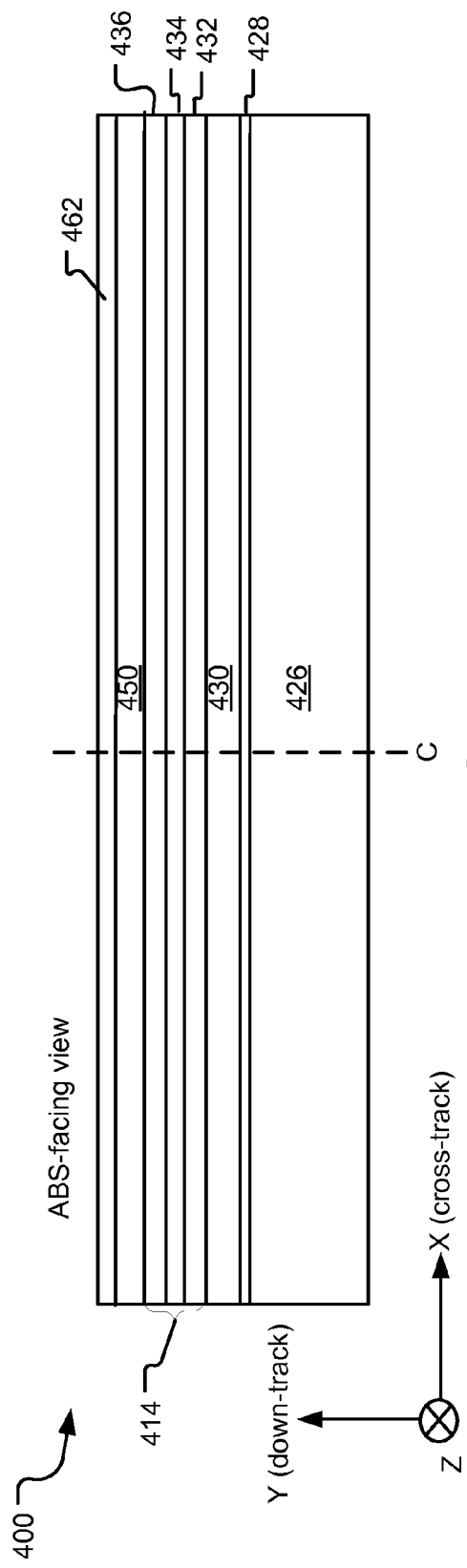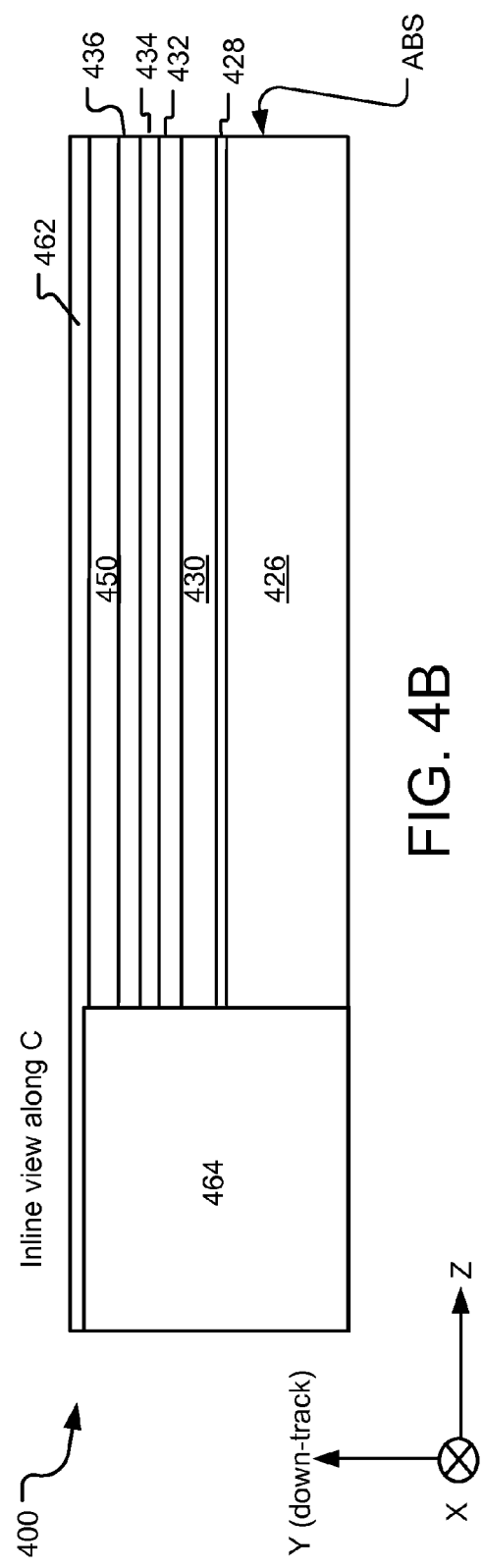

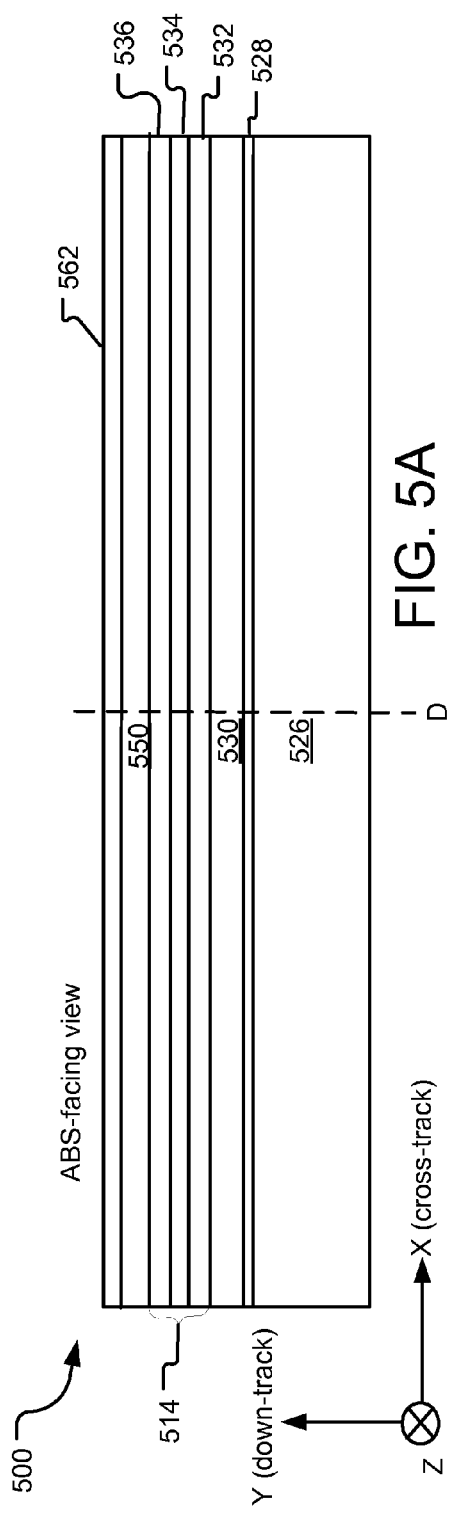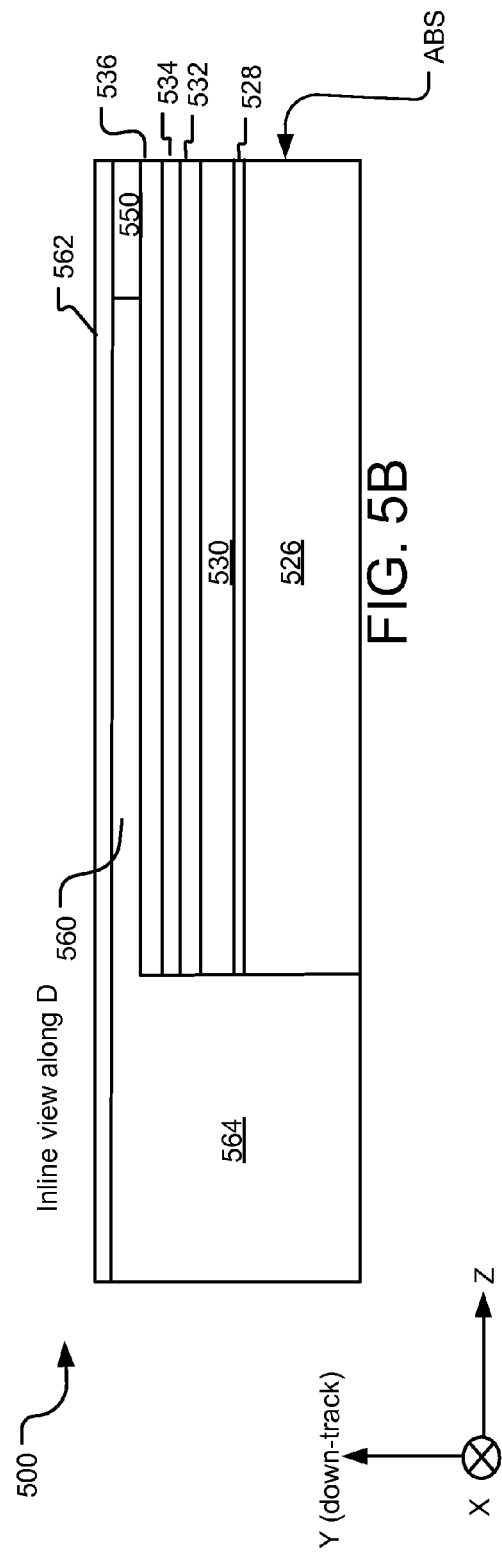

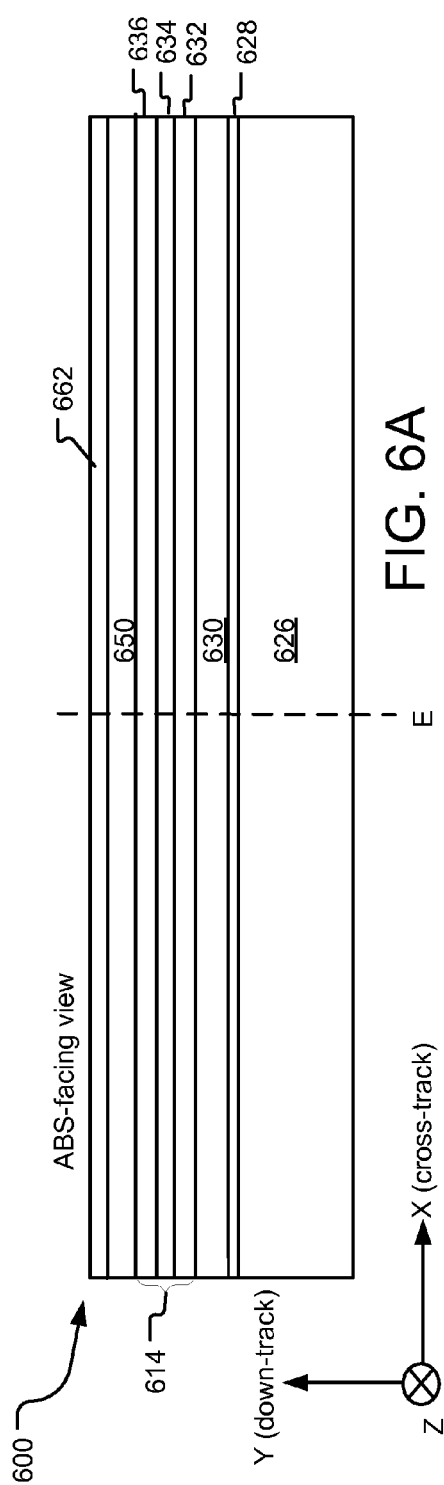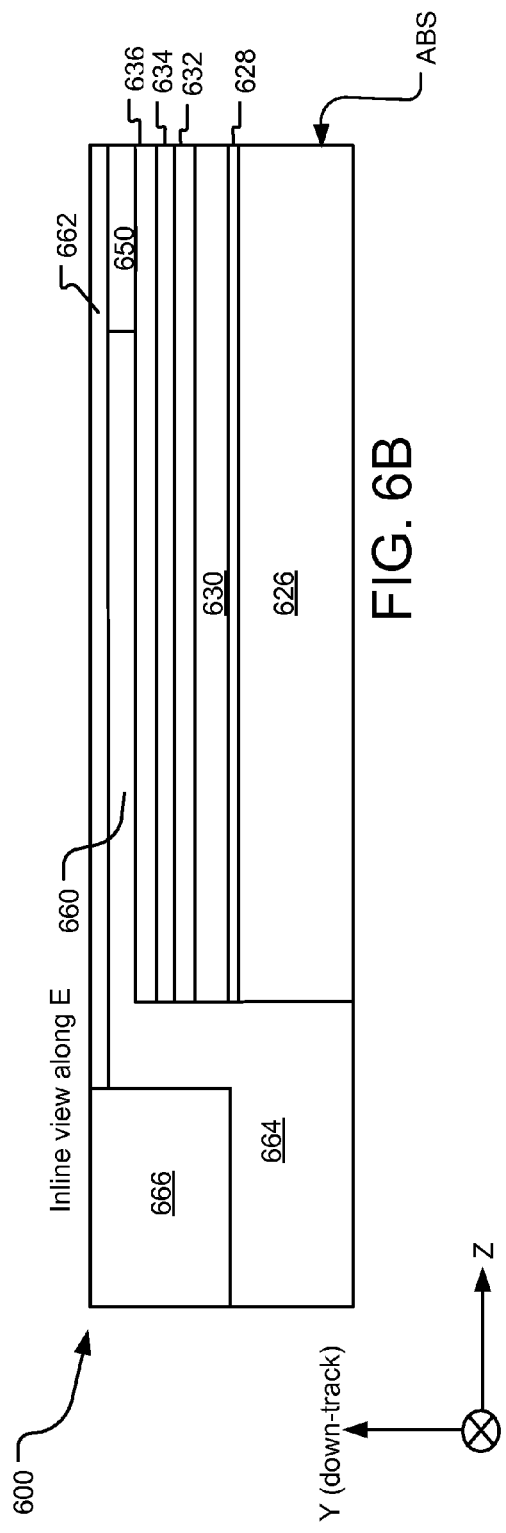

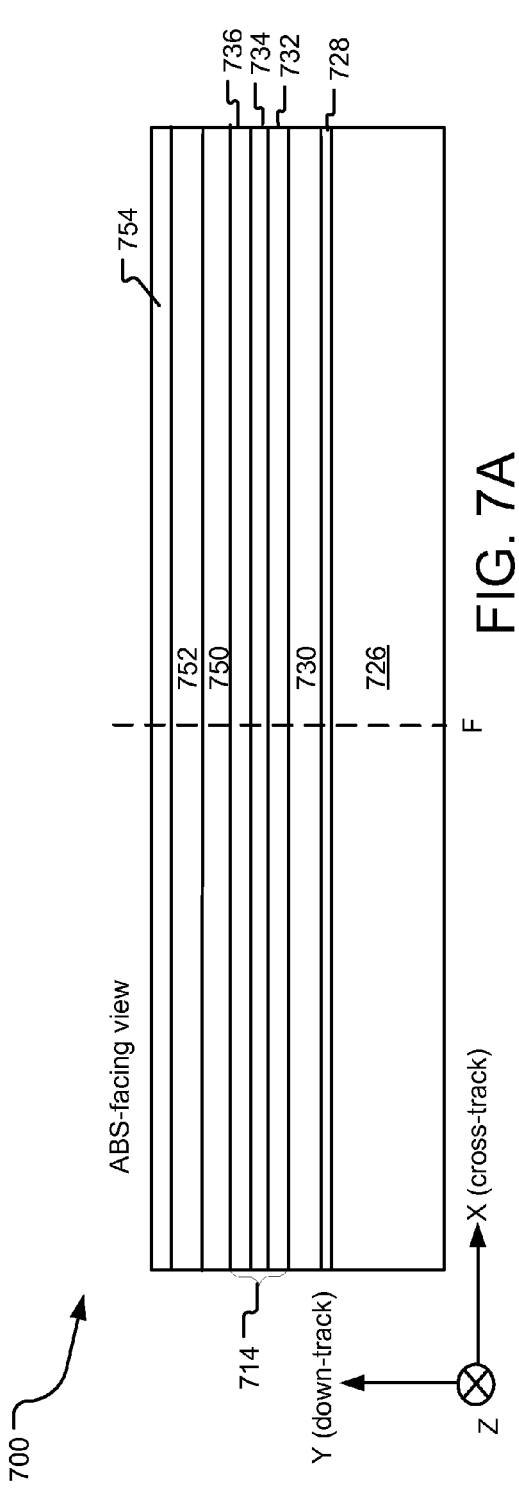
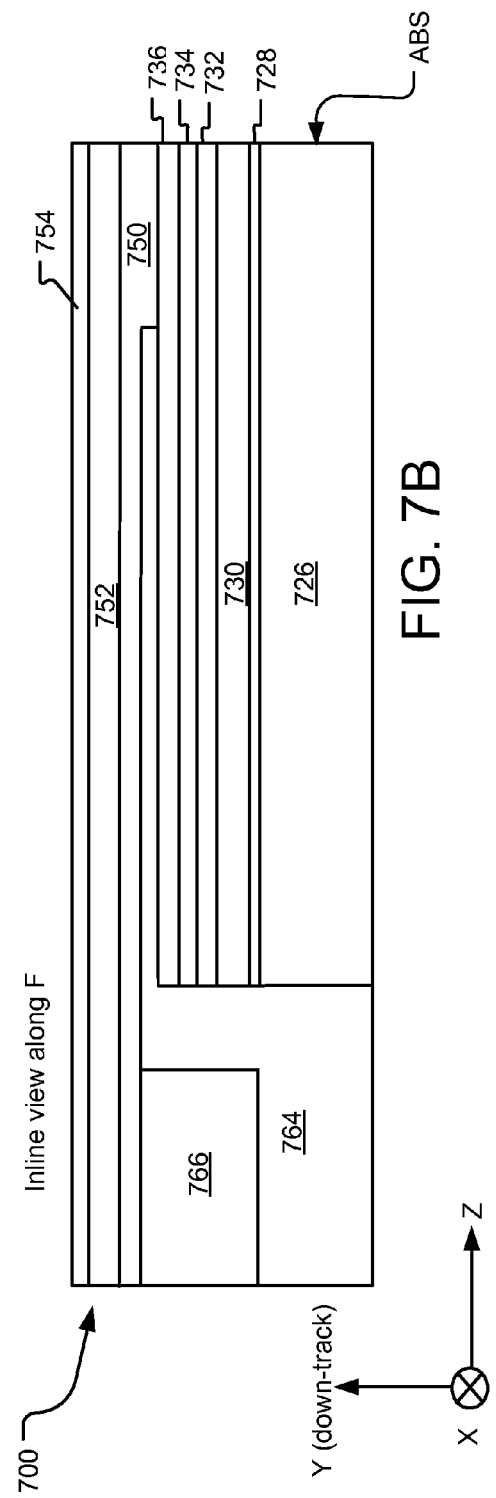

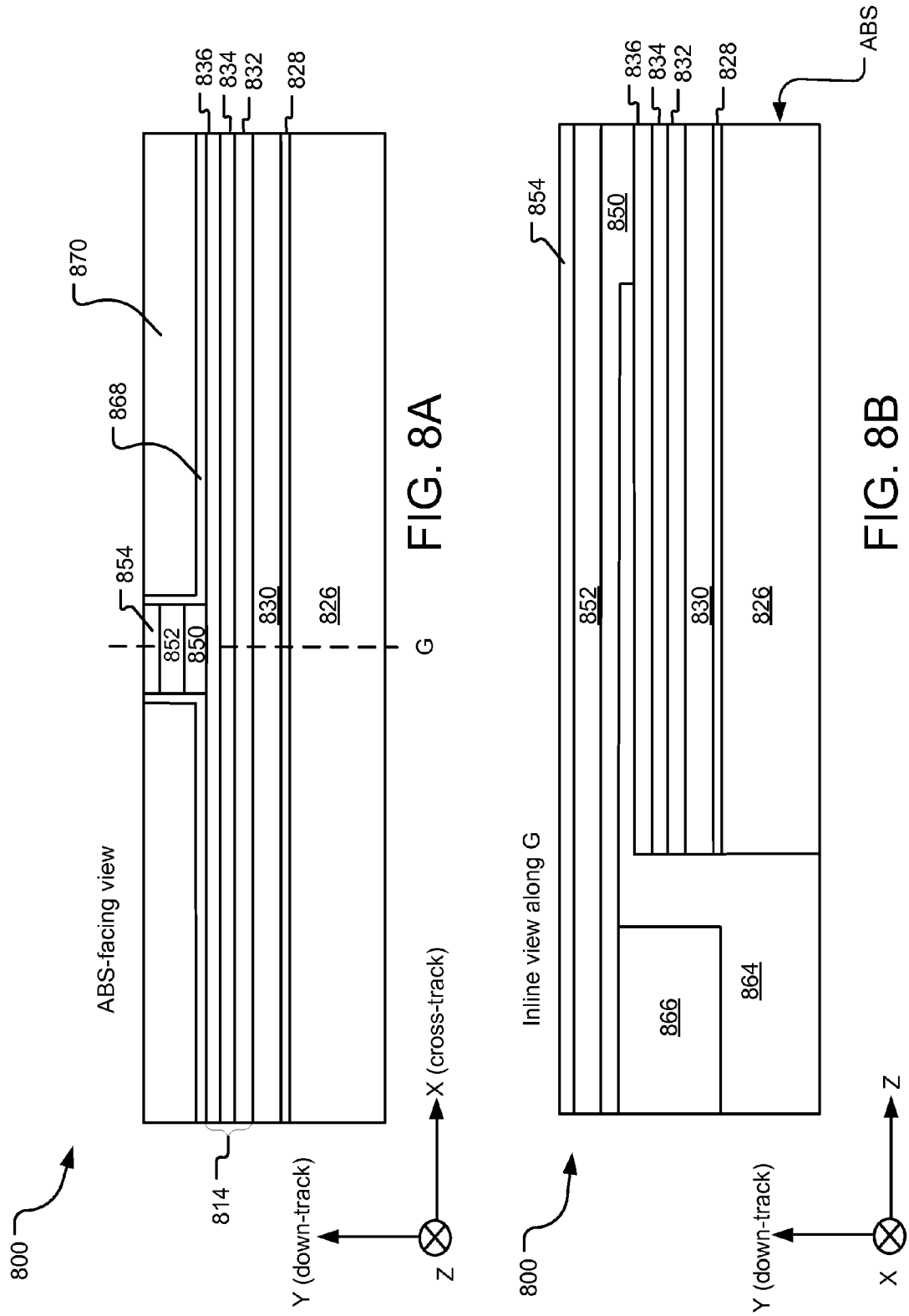

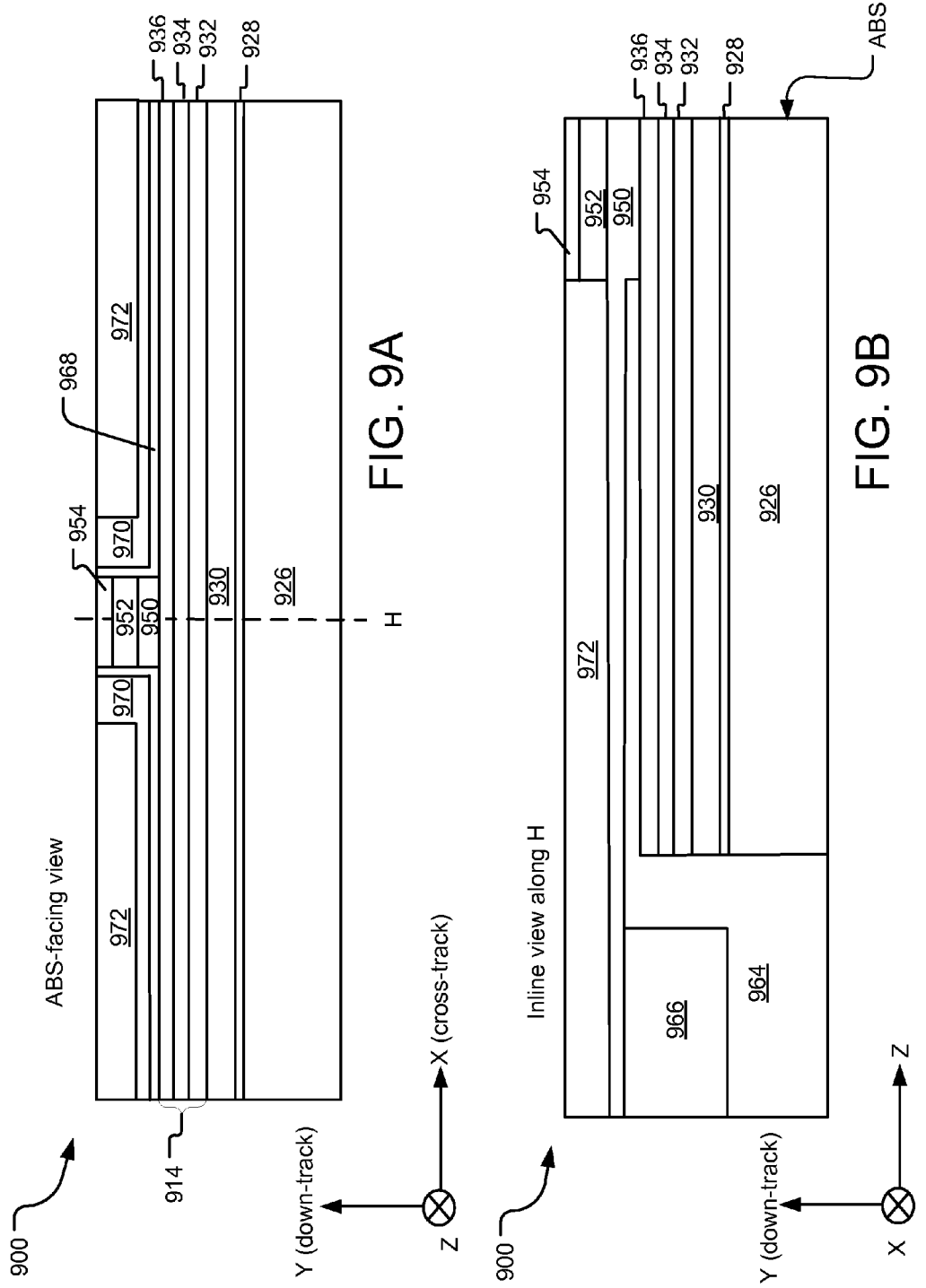

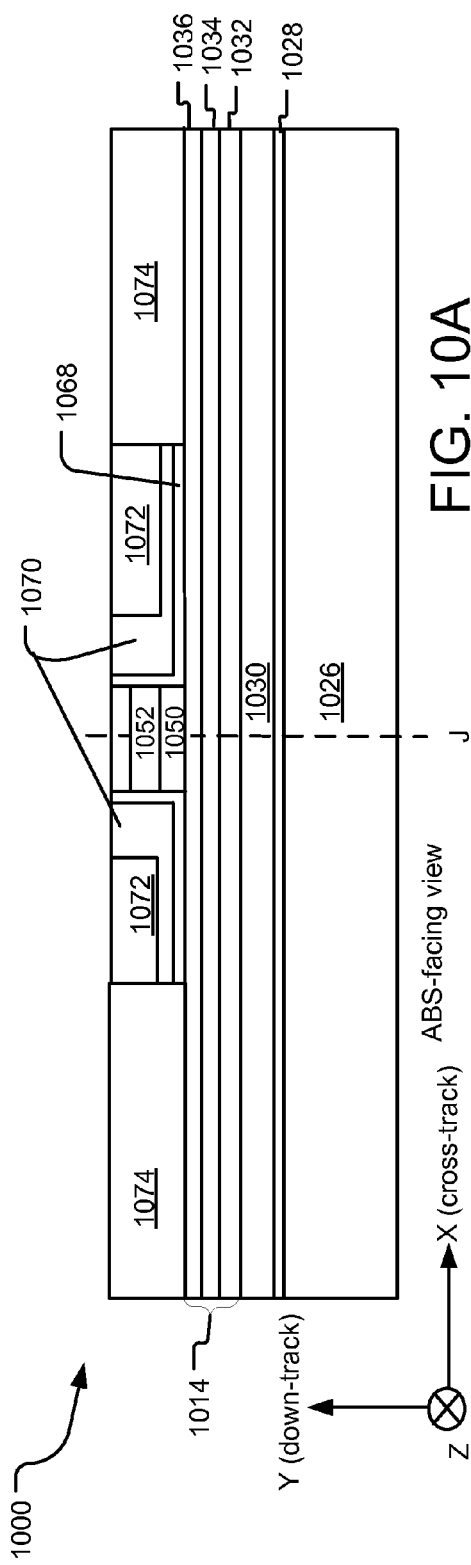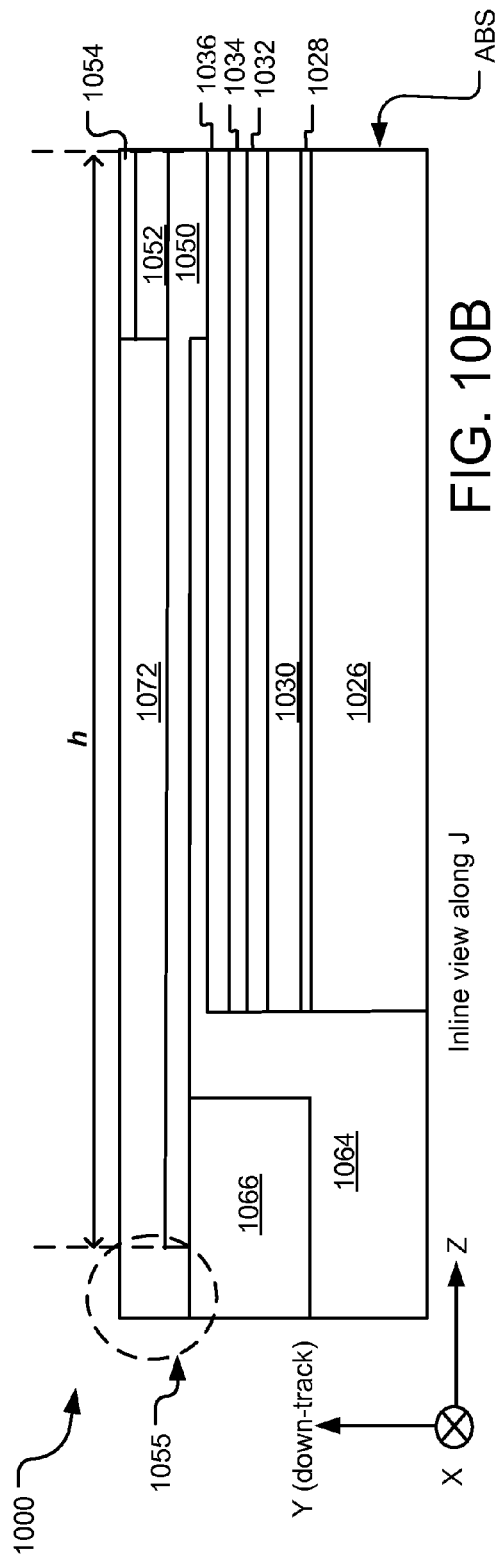

SPIN TRANSPORT SENSOR

BACKGROUND

Generally, magnetic hard disc drives include transducer heads that read and write data encoded in tangible magnetic storage media. Magnetic flux detected from the surface of the magnetic medium causes rotation of a magnetization vector of a sensing layer or layers within a magnetoresistive (MR) sensor within the transducer head, which in turn causes a change in electrical resistivity of the MR sensor. The change in resistivity of the MR sensor can be detected by passing an electrical current through the MR sensor and measuring the resulting change in voltage across the MR sensor. Related circuitry can convert the measured voltage change information into an appropriate format and manipulate that information to recover the data encoded on the disc.

As improvements in magnetic recording density capabilities are pursued, the dimensions of transducer heads continue to shrink. Typically, transducer heads are formed as a thin film multilayer structure having an MR sensor, among other structures. In some approaches, such as magnetoresistive sensors that utilize tunnel magnetoresistance (TMR) or giant magnetoresistance (GMR) effects, the thin film multilayer structure includes an antiferromagnet (AFM) and a synthetic anti-ferromagnet (SAF) to enhance MR sensor stability. However, the presence of an AFM/SAF structure can nevertheless limit future downscaling of the MR sensor. In addition, electrical current passed through sensing layers of some MR sensors can generate thermal noise that degrades a signal-to-noise (SNR) ratio of the sensor.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

Implementations described and claimed herein address the foregoing by providing for a magnetoresistive sensor with a synthetic antiferromagnet (SAF) that extends to an air bearing surface (ABS). The SAF serves as a shield and provides a current path for a spin-polarized current through an ABS-region of a spin conductor layer. Other embodiments are also described and recited herein.

BRIEF DESCRIPTIONS OF THE DRAWINGS

FIG. 2A illustrates an air-bearing surface (ABS)-facing view of an example MR sensor.

FIG. 2B illustrates an inline view of the MR sensor of FIG. 2A.

FIG. 3A illustrates an ABS-facing view of another example MR sensor.

FIG. 3B illustrates an inline view of the MR sensor of FIG. 3A.

FIG. 4A illustrates an ABS-facing view of another example MR sensor.

FIG. 4B illustrates an inline view of the MR sensor of FIG. 4A.

FIG. 5A illustrates an ABS-facing view of another example MR sensor.

FIG. 5B illustrates an inline view of the MR sensor of FIG. 5A.

FIG. 6A illustrates an ABS-facing view of another example MR sensor.

FIG. 6B illustrates an inline view of the MR sensor of FIG. 6A.

FIG. 7A illustrates an ABS-facing view of another example MR sensor.

FIG. 7B illustrates an inline view of the MR sensor of FIG. 7A.

FIG. 8A illustrates an ABS-facing view of another example MR sensor.

FIG. 8B illustrates an inline view of the MR sensor of FIG. 8A.

FIG. 9A illustrates an ABS-facing view of another MR sensor.

FIG. 9B illustrates an inline view of the MR sensor of FIG. 9A.

FIG. 10A illustrates an ABS-facing view of another MR sensor.

FIG. 10B illustrates an inline view of the MR sensor of FIG. 10A.

DETAILED DESCRIPTION

In some implementations, MR sensors are formed as a multilayer structure or stack in a thin film process. The MR sensor stack includes a first magnetic layer, called a "free" layer, and a second magnetic layer, called a "reference layer." The free layer represents a sensing layer that responds to changes in magnetic flux detected from the surface of the magnetic surface (e.g., the magnetizing vector of the free layer rotates), while the response of the reference layer to such changes in magnetic flux are inhibited by a pinned layer which is separated from the reference layer by a thin nonmagnetic spacer layer.

Signal-to-noise can be improved in a recording system by reducing a shield-to-shield spacing of the MR sensor. One way of reducing the shield-to-shield spacing of an MR sensor is by recessing the reference layer from the ABS and providing a lateral (e.g., cross-track) current path between the reference layer and the free layer, rather than a vertical (i.e., down-track) current path between the reference layer and the free layer. Sensors providing for this type of lateral current path are referred to as "lateral spin transport" sensors. In one example lateral spin transport sensor, the reference layer is separated from the ABS and included at the back of the sensor (e.g., behind the free layer and distal to the ABS). A spin-polarized current flows from the reference layer to a spin conductor layer, and a spin component of the current diffuses laterally through the spin conductor layer toward the ABS and into the free layer. This flow of spin current allows a voltage signal to be measured in the free layer. The measured voltage signal fluctuates as a magnetization vector of the free layer responds to the magnetic fields of passing magnetized bits on a rotating media.

In addition to reducing shield-to-shield spacing, a lateral spin transport sensor may also provide for reduced heat and noise because the current responsible for the measured voltage signal is a spin current rather than an electrical current. However, some effects of lateral spin transport sensors can nonetheless limit sensor performance. For example, a decay in sensor signal strength may result from separating the reference layer from the free layer.

According to one implementation, an MR sensor disclosed herein provides for spin current sensing and decreased shield-to-shield spacing similar to a lateral spin transport sensor without a corresponding signal decay that occurs as a result of flowing current over a lateral distance between a spin injection source and a free layer.

Figure 1:
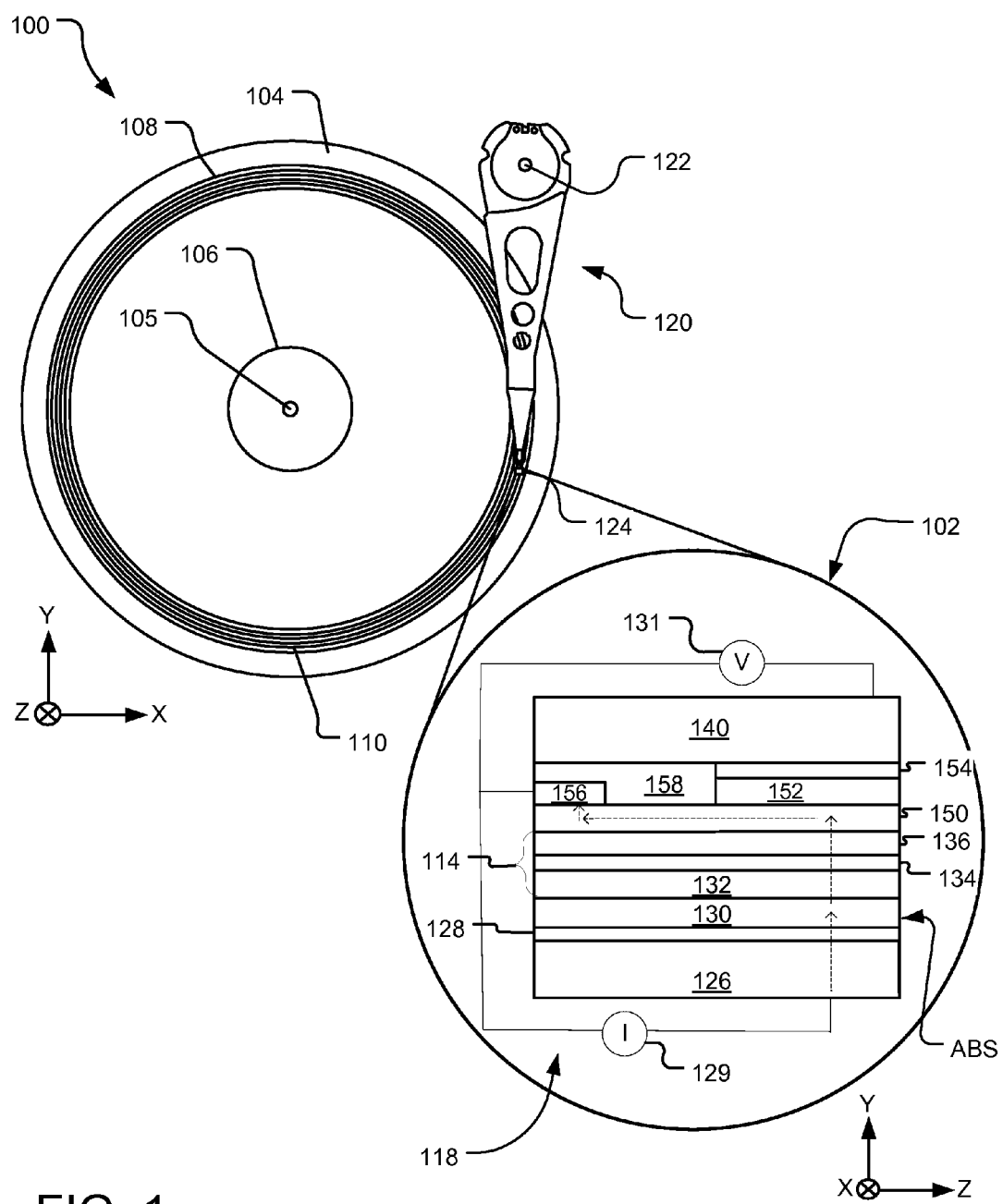
FIG. 1 illustrates a data storage device having an example MR sensor formed by a process of the described technology.

FIG. 1 illustrates a data storage device 100 having an example MR sensor, shown in more detail in an exploded view 102, formed by a process of the described technology. Although other implementations are contemplated, in the illustrated implementation, the data storage device 100 includes a storage medium 104 (e.g., a magnetic data storage disc) on which data bits can be recorded using a magnetic write pole and from which data bits can be read using an MR sensor 118 (shown in the exploded view 102 as a portion of a transducer head assembly 124). The storage medium 104 rotates about a spindle center or a disc axis of rotation 105 during rotation, and includes an inner diameter 106 and an outer diameter 108 between which are a number of concentric data tracks 110. It should be understood that the described technology may be used with a variety of storage formats, including continuous magnetic media, discrete track (DT) media, shingled media, bit patterned media (BPT), etc.

Information can be written to and read from data bit locations in the data tracks 110 on the storage medium 104. The transducer head assembly 124 is mounted on an actuator assembly 120 at an end distal to an actuator axis of rotation 122. The transducer head assembly 124 flies in close proximity above the surface of the storage medium 104 during disc rotation. The actuator assembly 120 rotates during a seek operation about the actuator axis of rotation 122. The seek operation positions the transducer head assembly 124 over a target data track for read and write operations.

The exploded view 102 schematically illustrates a cross-sectional view of an MR sensor 118 taken along the down-track direction. The MR sensor 118 utilizes magnetoresistance to read data from the media disk 108. While the precise nature of the MR sensor 118 may vary widely, a tunneling magneto-resistive (TMR) sensor is described as one example of an MR sensor that can be utilized with the presently-disclosed technology.

The MR sensor 118 includes an upper shield 140 and a lower shield 126 that protect inner layers of the MR sensor 118 from electromagnetic interference, primarily down-track interference, and serve as electrically conductive first and second electrical leads. Between the upper shield 140 and the lower shield 126, the MR sensor 118 includes a plurality of layers that perform a plurality of functions. In particular, the MR sensor 118 includes a free layer 152, a capping layer 154, an isolation layer 158, and an electrical contact layer (i.e., an electrical terminal 156). The free layer 152 may be a soft magnetic layer with a magnetization vector that is free to rotate in response to magnetic fields of passing bits on an adjacent magnetic media; the capping layer 154 magnetically isolates the free layer 152 from the upper shield 140; and the isolation layer 158 electrically isolates the electrical terminal 156 and underlying layers from the upper shield 140.

Further, the MR sensor 118 includes a spin conductor layer 150 that allows electron spin to diffuse into the free layer 152 while shunting electrical current to the electrical terminal 156. Thus, the spin conductor layer 150 is a layer of material with a long spin diffusion length (X), which is the distance over which a non-equilibrium spin population can propagate within the material. A variety of materials are suitable for the spin conductor layer including, for example, copper ($\lambda$~200-400 nm), gold ($\lambda$~300-400 nm), aluminum ($\lambda$~300-400 nm), and silver ($\lambda$~100-200 nm). In some implementations, the spin conductor layer 150 may comprise one or more materials with a spin diffusion length on the order of microns, such as sillicon or gallium-arsenic.

The spin-conductor layer 150 is adjacent, on a first side, to an electrical terminal 156, the isolation layer 158, and the free layer 152. A second side of the spin conductor layer 150 is adjacent to a first side of a synthetic antiferromagnet (SAF) 114. The SAF 114 includes a pinned layer 132, a coupling spacer layer 134, and a reference layer 136. A second, opposite side of the SAF 114 is adjacent an AFM layer 130, which is adjacent on an opposite side to an AFM seed layer 128.

The AFM seed layer 128 underlies the AFM layer 130 and initiates a desired grain structure in the layers of the SAF 114. The AFM layer 130 biases the magnetic orientation of the pinned layer 132 in a direction perpendicular to an air-bearing surface (ABS) of the MR sensor 118. The coupling spacer layer 134 provides for antiferromagnetic coupling between the reference 136 and the pinned layer 132. In one implementation, the reference layer 136 and the pinned 132 are soft magnetic layers. In the same or another implementation, the coupling spacer layer is ruthenium or another RKKY-coupling material.

The electrical terminal 156 is formed at the back of the MR sensor 118 (e.g., forming a surface opposite the ABS) and serves as an electrical lead for the MR sensor 118. In one implementation, the electrical terminal 156 serves as a ground connection. The electrical terminal 156 is adjacent to the spin conductor layer 150.

In one implementation, a current generation source 129 generates a spin-polarized current that flows along a path through the SAF 114 (e.g., an example path illustrated by dotted arrows in FIG. 1). In particular, the spin-polarized current flows through the SAF 114 and through the spin conductor layer 150 to the electrical terminal 156, which is electrically grounded. A spin component (not shown) of the spin-polarized current can additionally flow between the spin conductor layer 150 and the free layer 152, generating a purely electrical voltage across the free layer 152. This voltage can be detected by a voltage sensing device 131 that is connected to the upper shield 140 and a ground connection coupled to the electrical terminal 156.

In the MR sensor 118, the distance that the spin current diffuses between the SAF 114 and the free layer 152 is relatively short. In one implementation, the distance that the spin current diffuses is the down-track thickness of the spin conductor 150, which may be, for example, between 1 and 100 nm. In one implementation, the distance that the spin current diffuses is less than or equal to about 10 nm. In contrast, the distance that spin current diffuses to reach a sensing layer in a lateral spin sensing device can be much greater, such as on the order of hundreds of microns. Therefore, the MR sensor 118 provides a spin current path that is shorter than a spin current path of some lateral spin sensing devices. Additionally, the MR sensor 118 provides for a shield-to-shield spacing that is akin to or smaller than a shield-to-shield spacing of some lateral spin sensing devices.

FIGS. 2A-2B illustrate an example MR sensor 200. When describing various MR sensors herein, three axes are used to describe the perspective of the accompanying figure. The X-axis represents a cross-track axis. A cross-sectional view of the Y-Z plane taken from a position along the X-axis is referred to herein as an "inline" view. The Y-axis represents the down track axis, which is also typically the axis of thin film processing (e.g., the reader stack grows along the Y axis). The Z-axis represents the air bearing surface (ABS) axis, such that any figure depicted in a plane that is orthogonal to the Z axis represents a surface or cross-section that is parallel to the ABS. Thus, a cross-sectional view of the X-Y plane taken from a position along the Z-axis is referred to herein as an "ABS-facing" view.

Additionally, the term "ABS-portion" is used to refer to a region proximal or adjacent to an air-bearing surface (ABS) of various MR sensors disclosed herein. The term "back portion" is used to refer to a region proximal or adjacent to a surface that is opposite the ABS.

FIG. 2A illustrates an ABS-facing view of the MR sensor 200. FIG. 2B illustrates an inline view of the MR sensor 200 taken along plane B shown in FIG. 2A. The MR sensor 200 includes an upper shield 248 and a lower shield 226. The upper shield 248 and lower shield 226 may be made be of the same or different soft magnetic material, such as a NiFe, CoFe, or an alloy thereof.

The upper shield 248 is adjacent to a first AFM layer 246, which pins a magnetic orientation of an adjacent pinned layer (i.e., the first pinned layer 244) in a set direction. A first coupling spacer layer 242 provides antiferromagnetic coupling between the first pinned layer 244 and a first reference layer 240. Together, the first pinned layer 244, the first coupling spacer layer 242, and the first reference layer 240 form an upper synthetic antiferromagnetic (SAF) 213 that stabilizes material of the first reference layer 240 and provides cross-track bias to the spin conductor layer 250. The upper SAF 213 is adjacent to side shields 241 and 243 on opposite sides of the MR sensor in the cross-track direction. In another implementation, permanent magnets are used to provide cross-track bias to the spin conductor layer 250.

In FIG. 2, both the upper shield 248 and the SAF 213 perform a shielding function. In other implementations, the MR sensor 200 does not include the upper SAFs 213. For example, a top shielding structure of the MR sensor 200 may be a bulk shield, such as a single layer of soft or hard magnetic material without an adjacent SAF structure. Alternatively, the upper shield 248 may be an AFM-stabilized layer of magnetic material without an adjacent SAF structure. In still other implementations, a top shielding structure includes a SAF structure, but does not include an additional bulk layer of magnetic material, such as the upper shield 248.

A bottom structure of the MR sensor 200 includes a lower SAF 214 formed by a second pinned layer 232, a second coupling layer 234, and a second reference layer 236. The second pinned layer 232 is adjacent to a second AFM layer 230, which is further adjacent to an AFM seed layer 228. The second SAF 214 is adjacent to a lower shield 226, which may also be a soft magnetic material, such as a ferromagnetic alloy (e.g., NiFe or CoFe).

The lower SAF 214 acts as both a spin polarizer of electrical current as well as a magnetic shield of a free layer 252 of the MR sensor 200. Specifically, the SAF 214 has a pinned magnetic moment that blocks external magnetic fields and allows for resistance changes to be measured within a free layer 252 as the magnetic moment of the spin conductor layer 250 rotates under the influence of localized magnetic fields.

In one implementation, a total y-direction thickness of the lower SAF 214 is between 10 and 100 nm. In another implementation, the thickness of the lower SAF 214 is between 20 and 60 nm. The second pinned layer 232 and second reference layer 236 are made of a magnetic material, such as CoFe, NiFe, or a ferromagnetic Heusler alloy. Example magnetic orientations of the reference layer 236 and the pinned layer 232 are indicated in each of FIGS. 2A and 2B.

In another implementation, the MR sensor 200 has a lower shield 226 without an adjacent SAF structure. The lower shield 226 may be a soft or hard magnetic material with a thickness substantially between 1 and 4 microns.

Sandwiched between the upper SAF 213 and the lower SAF 214 is a spin conductor layer 250. The spin conductor layer 250 is made of a conducting material with a long spin diffusion length $\lambda$. In one implementation, the spin diffusion length of the spin conductor layer 250 is greater than 100 nm. A current generation source 229 supplies a spin-polarized current to the lower shield 226. The current travels through the lower SAF 214 and to the spin conductor layer 250.

A variety of materials may be suitable for the spin conductor layer 250 including without limitation copper, gold, and aluminum. In one implementation, the spin conductor layer has a thickness of approximately 10 nm.

Within the spin conductor layer 250, spin component of the spin-polarized current diffuses into the free layer 252. This spin current generates a purely electrical voltage across the free layer 252, which is detected by a voltage sensing loop 231. The voltage sensing loop 231 electrically couples the upper shield 248 to the electrical terminal 256 on the back portion of the MR sensor 200.

In addition to layers discussed above, the MR sensor 200 also includes a capping layer 254. The capping layer 254 may have a spin diffusion length short enough to prevent spin current from entering the upper SAF 213. In one implementation, the capping layer 254 has a spin diffusion length of less than or equal to 10 nanometers. A back edge (i.e. distal to the ABS) of the capping layer 254 is adjacent to an isolation layer 258. The isolation layer 258 is an electrical isolator layer that isolates the electrical terminal 256 from the upper SAF 213. Other implementations may include layers in addition to or in place of those illustrated in FIGS. 2A-2B.

In FIGS. 2A and 2B, the lower SAF 214 acts as both a lower shield and a spin injector to the spin conductor layer 250. Therefore, the effective shield-to-shield spacing of the MR sensor 200 is a y-direction (down-track) thickness of the free layer 252, the capping layer 254, and the spin conductor layer 250.

Allowing the lower SAF 214 to extend to the ABS (as shown) permits a flow of the polarized-spin current in close proximity to the ABS. As a result, the distance an electron spin has to diffuse to reach the free layer 252 is decreased. The shorter the spin-diffusion distance, the stronger the spin current is within the free layer 252. A stronger spin current in the free layer 252 translates to a stronger read signal from the MR sensor 200.

FIGS. 3A-3B illustrate another example MR sensor 300. FIG. 3A illustrates an ABS-facing view of the MR sensor 300; and FIG. 3B illustrates an inline view of the MR sensor 300 taken along plane C shown in FIG. 3A. The MR sensor 300 includes an upper shield 348 and a lower shield 326, which may be a soft magnetic material, such as a NiFe, CoFe, or an alloy thereof.

The MR sensor 300 includes a plurality of layers, which may be the same or similar to corresponding layers described with respect to FIGS. 1, 2A, and 2B. In particular, the MR sensor 300 includes an upper shield 348 and an upper SAF 313. The upper SAF 313 further comprises a pinned layer 344, a coupling spacer layer 342, and a reference layer 340. The pinned layer 344 is adjacent to an AFM layer 346 that biases the magnetic moment of the pinned layer 344. The upper SAF 313 is adjacent to side shields 341 and 343 on either side of a sensing stack.

The MR sensor 300 also includes a lower shield 326 adjacent to a lower SAF 314. In particular, the lower SAF 314 includes a pinned layer 332, a spacer coupling layer 334, and a reference layer 336. The lower shield 326 and the lower SAF 314 are separated by an AFM seed layer 328 and an AFM layer 330, Between the upper SAF 313 and the lower SAF 314 is a spin conductor layer 350, a free layer 352, a capping layer 354, a first isolation layer 358, a second isolation layer 360, and an electrically conductive metal contact 356. A voltage sensing loop 331 couples the upper shield 348 to the electrically conductive metal contact 356, which is electrically grounded. The voltage sensing loop 331 detects voltage changes across the free layer 352. In other implementations, the MR sensor 300 includes one or more layers in addition to or in place of those shown in FIG. 3.

The second isolation layer 360 (e.g., a layer not included in either of FIG. 1, 2A, or 2B) is an insulating layer, such as $SiO_2$ or $Al_2O_3$, that blocks y-direction (down-track) current flow between the lower SAF 314 and spin conductor layer 350. Because the insulating layer is recessed from the ABS, a current flow between the lower SAF 314 and the free layer 252 is constrained to a path through the spin conductor layer 350 that is around the second isolation layer 360 and within a region proximal to the ABS (e.g., as illustrated by an example current path shown by dotted arrows). By confining substantially all y-direction current flow from the current generation source 329 to within this ABS-region, the distance that the spin current diffuses to reach the free layer 352 is decreased or eliminated in the z-direction.

According to the implementation of FIG. 3, the spin current travels in a direction substantially parallel to the ABS as it passes through the spin conductor layer. In this or another implementation, the distance that an electron diffuses to reach the free layer 352 can be accurately controlled by varying the thickness of the spin conductor layer 350.

Because second isolation layer 360 restricts the down-track path of current flow, it has the effect of increasing current density in the ABS-region of the free layer 352 where voltage changes are detected. This increase in current density translates to an increased read signal strength. In addition, the second isolation layer 360 has the effect of preventing electron spin from diffusing back into the reference layer 336 of the lower SAF 314.

According to one implementation, the output of the MR sensor 300 is roughly proportional to:

$$e^{\frac{-L}{\lambda}} \quad (1)$$

where L is the distance that the spin needs to diffuse and λ is the spin diffusion length of the spin conductor at room temperature. In one example implementation, a layer of copper between 10 and 100 nm thick is used as the spin conductor layer 350.

In one example implementation, the second isolation layer 360 is recessed from the ABS by a z-direction distance of between about 10 and 100 nm. Other features of the MR sensor 300 that are not described may be the same or similar to other implementations described herein.

FIGS. 4A-4B illustrate an example MR sensor 400 at an early stage of an MR sensor manufacturing process. FIG. 4A illustrates an ABS-facing view of the MR sensor 400. FIG. 4B illustrates an inline view of the MR sensor 400 taken along plane C shown in FIG. 4A. The MR sensor 400 may be defined by a series of photolithography and deposition processes.

The MR sensor 400 includes a lower shield element 426 and a lower SAF 414. The lower SAF 414 includes a pinned layer 432, a spacer coupling layer 434, and a reference layer 436. The pinned layer 432 is adjacent to an AFM layer 430, which is further adjacent to an AFM seed layer 428. The MR sensor 400 also includes a spin conductor layer 450 adjacent to the reference layer 436.

As seen in the inline view of FIG. 4B, a back portion of the MR sensor 400 is removed, such as via an ion milling, mechanical etching, or chemical etching process. The area where material is removed away is backfilled with an insulating material, such as aluminum-oxide, forming a back insulator block 464. A noble metal cap 462 is deposited on the spin conductor layer 450 and the back insulator block 464. The noble metal cap 462 protects portions of the MR sensor 400 during a chemical mechanical polishing (CMP) process. In one implementation, the noble metal cap 462 is a thin layer of ruthenium approximately 2 nm thick.

The MR sensor 400 is polished and planarized in a chemical mechanical polishing (CMP) process.

FIGS. 5A-5B illustrate an example MR sensor 500 at another early stage of an MR sensor manufacturing process. FIG. 5A illustrates an ABS-facing view of the MR sensor 500. FIG. 5B illustrates an inline view of the MR sensor 500 taken along plane D shown in FIG. 5A.

In FIGS. 5A and 5B, a portion of a spin conductor layer 550 is removed (e.g., milled or etched away) in back and middle portions of the MR sensor 500. A thin insulator layer 560 is backfilled into the area where the material is removed. In one implementation, the thin insulator layer 560 is the same material as material of a back-insulator block 564. In another implementation, the thin insulator layer 560 is a different material than the back-insulator block 564.

A noble metal cap layer 562 is deposited on top of the MR sensor 500 to protect portions of the MR sensor during a CMP process.

In addition to layers described above, the MR sensor 500 includes a lower shield element 526 and a lower SAF 514. The lower SAF 514 includes a pinned layer 532, a spacer coupling layer 534, and a reference layer 536. The pinned layer 532 is adjacent to an AFM layer 530. The AFM layer 530 is further adjacent an AFM seed layer 528. A spin conductor layer 552 is deposited on the lower SAF 514. Each of these layers may perform the same or similar functions as corresponding layers in other implementations described herein.

FIGS. 6A-6B illustrate an example MR sensor 600 at another stage of an MR sensor manufacturing process. FIG. 6A illustrates an ABS-facing view of the MR sensor 600. FIG. 6B illustrates an inline view of the MR sensor 600 taken along plane E shown in FIG. 6A. As illustrated in FIGS. 6A and 6B, a back portion of the MR sensor 600 is removed, such as via a milling, mechanical etching, or chemical etching process. Specifically, a back portion of a back insulator block 664 is removed and backfilled with a metal material that serves as an electrical terminal 666. After the electrical terminal 666 is formed, the MR sensor 600 undergoes another CMP process.

In addition to layers described above, the MR sensor 600 includes a lower shield element 626 and a lower SAF 614. The lower SAF 614 includes a pinned layer 632, a spacer coupling layer 634, and a reference layer 636. The pinned layer 632 is adjacent to an AFM layer 630, which is further adjacent an AFM seed layer 628. A noble metal cap 662 and a spin conductor layer 650 are formed on the SAF 614, as shown.

Each of these layers may perform the same or similar functions as corresponding layers in other implementations described herein.

FIGS. 7A-7B illustrate an example MR sensor 700 at another stage of an MR sensor manufacturing process. FIG. 7A illustrates an ABS-facing view of the MR sensor 700. FIG. 7B illustrates an inline view of the MR sensor 700 taken along plane F shown in FIG. 7A. A plasma treatment can be performed to remove a noble metal cap (e.g., the noble metal cap 662 of FIG. 6) and part of the spin conducting material of the spin conductor layer 750 that is deposited in FIG. 4. Additional material of the spin conductor layer 750 is deposited to extend the z-direction length of the spin conductor layer 750 from an ABS-region to a back region of the MR sensor, forming a surface opposite the ABS. This spin conductor material is deposited on top of and adjacent to a thin insulator layer 760. Material of a free layer 752 is then deposited on the spin conductor layer 750, and one or more capping layers 754 are deposited on the free layer 752. In one implementation, the capping layer has a short spin-diffusion length (e.g., less than 5 nm). The short spin-diffusion length operationally prevents spin current from entering an upper shield structure (not shown) and introducing noise from the upper shield structure.

In one implementation, an additional contact layer (not shown) is included on one or both sides of the spin conductor layer 750 to further promote spin-dependent transport between the spin conductor layer 750 and a free layer 752. For example, the additional contact layer may be included between the spin conductor layer 750 and the free layer 752. In the same or another implementation, the additional contact layer may be positioned between the spin conductor layer 750 and the reference layer 736. This contact layer may be a tunnel barrier or a conductor that allows electrons with a first spin orientation to pass while scattering electrons with another type of spin orientation.

In addition to layers described above, the MR sensor 700 includes a lower shield element 726 and a lower SAF 714. The lower SAF 714 includes a pinned layer 732, a spacer coupling layer 734, and a reference layer 736. The pinned layer 732 is adjacent to an AFM layer 730, which is further adjacent an AFM seed layer 728. The MR sensor 700 further includes a capping layer 754, an insulating layer 764, and an electrical terminal 766. Each of these layers may perform the same or similar functions as corresponding layers in other implementations described herein.

FIGS. 8A-8B illustrate an example MR sensor 800 at another stage of an MR sensor manufacturing process. FIG. 8A illustrates an ABS-facing view of the MR sensor 800. FIG. 8B illustrates an inline view of the MR sensor 800 taken along plane G shown in FIG. 8A. Sides of the MR sensor 800 (e.g., sides in the cross-track direction) are removed, such as via a milling or etching process. A thin isolation layer 868 (visible in FIG. 8A) is deposited across the MR sensor 800. Side shield material 870 is deposited on top of the isolation layer 868, and the MR sensor 800 undergoes a CMP process to smooth the upper surface.

In addition to layers described above, the MR sensor 800 includes a lower shield element 826 and a lower SAF 814. The lower SAF 814 includes a pinned layer 832, a spacer coupling layer 834, and a reference layer 836. The pinned layer 832 is adjacent to an AFM layer 830, which is further adjacent an AFM seed layer 828. In addition, the MR sensor 800 further includes a spin conductor layer 850, a free layer 852, a capping layer 854, an insulating layer 864, and an electrical terminal 866. Each of these layers may perform the same or similar functions as corresponding layers in other implementations described herein.

FIGS. 9A-9B illustrate an example MR sensor 900 at another stage of an MR sensor manufacturing process. FIG. 9A illustrates an ABS-facing view of the MR sensor 900. FIG. 9B illustrates an inline view of the MR sensor 900 taken along plane H shown in FIG. 9A. In FIGS. 9A-9B, material of side shields 970 is removed in areas away from the cross-track center of the MR sensor 900. These regions are backfilled with additional insulating material 972.

As shown in the in-line view of FIG. 9B, material is also removed from a free layer 952, and capping layer 954. In particular, material is removed from these layers within back and middle regions of the MR sensor 900. These back and middle regions are backfilled with additional insulating material 972. The MR sensor 900 may then undergo another CMP process.

In addition to layers described above, the MR sensor 900 includes a lower shield element 926 and a lower SAF 914. The lower SAF 914 includes a pinned layer 932, a spacer coupling layer 934, and a reference layer 936. The pinned layer 932 is adjacent to an AFM layer 930, which is further adjacent an AFM seed layer 928. The MR sensor 900 further includes insulating layers 964 and 968, side shields 970, and an electrical terminal 966. Each of these layers may perform the same or similar functions as corresponding layers in other implementations described herein.

FIGS. 10A-10B illustrate an example MR sensor 1000 at another stage of an MR sensor manufacturing process. FIG. 10A illustrates an ABS-facing view of the MR sensor 1000. FIG. 10B illustrates an inline view of the MR sensor 1000 taken along plane J shown in FIG. 10A. In FIGS. 10A and 10B, material has been removed (e.g., milled or etched away) in a back portion of the MR sensor 1000 in a region indicated by a dotted circle 1055. This region is backfilled with the insulator material 1074. After the insulator material 1074 is deposited, the spin conductor layer 1050 has a total z-direction height "h" greater than a spin diffusion length of the material of the spin conductor layer 1050. In one implementation, the distance 'h' is greater than or substantially equal to 1 micron.

In addition to layers described above, the MR sensor 1000 includes a lower shield element 1026 and a lower SAF 1014. The lower SAF 1014 includes a pinned layer 1032, a spacer coupling layer 1034, and a reference layer 1036. The pinned layer 1032 is adjacent to an AFM layer 1030, which is further adjacent an AFM seed layer 1028. The MR sensor 1000 further includes a spin conductor layer 1050; a free layer 1052; a capping layer 1054; side shields 1070, insulating layers 1064, 1068, and 1074; and an electrical terminal 1066. Each of these layers may perform the same or similar functions as corresponding layers in other implementations described herein.

Figure 11A:
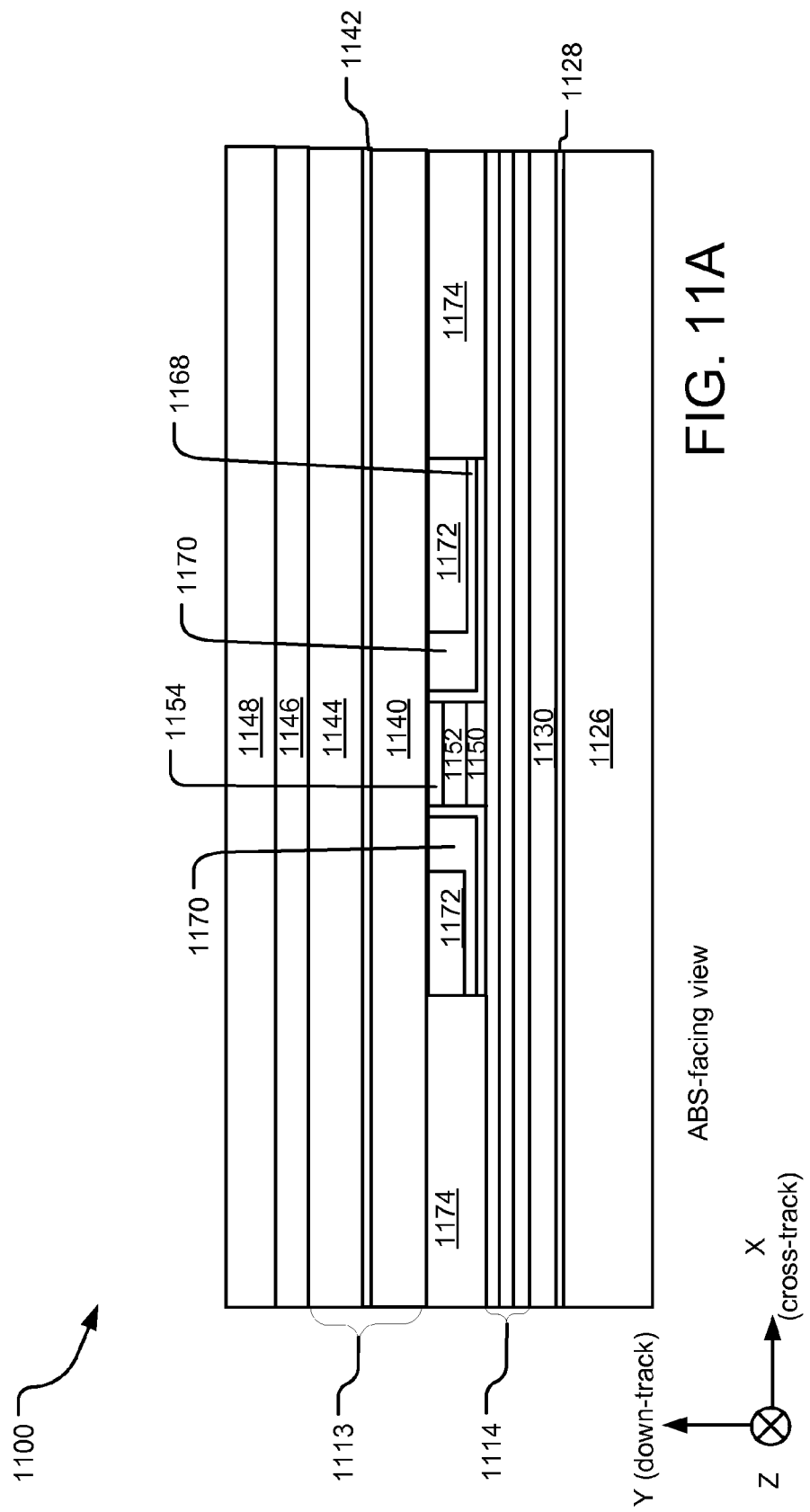
FIG. 11A illustrates an ABS-facing view of another MR sensor.
Figure 11B:
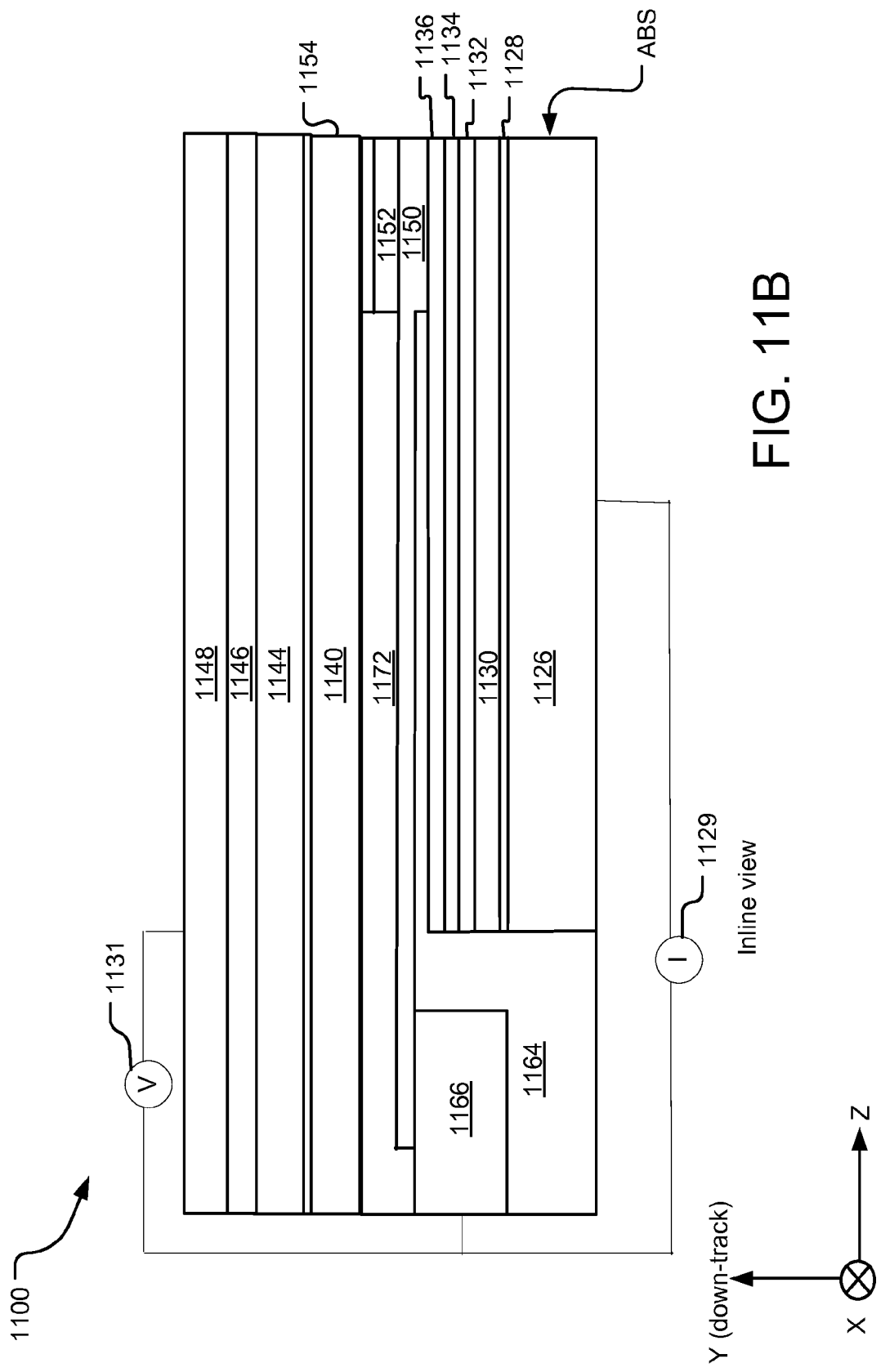
FIG. 11B illustrates an inline view of the MR sensor of FIG. 11A.

FIGS. 11A-11B illustrates an example MR sensor 1100 at a later stage of an MR sensor manufacturing process. FIG. 11A illustrates an ABS-facing view of the MR sensor 1100. FIG. 10B illustrates an inline view of the MR sensor 1100 taken along a cross-track center of the MR sensor of FIG. 11A. In FIGS. 11A and 11B, an upper SAF 1113 is formed, including a reference layer 1140, a spacer coupling layer 1142, and a pinned layer 1144. An AFM layer 1146 is deposited on the pinned layer 1144 to bias a magnetic orientation of the pinned layer 1144. An upper shield 1148 is deposited on the AFM layer 1146.

In addition to layers described above, the MR sensor 1100 includes a lower shield element 1126, an AFM layer 1130, an AFM seed layer 1128, and a lower SAF 1114 including the same or substantially the same layers as those described with respect to other implementations. The MR sensor 1100 also includes a spin conductor layer 1150; a free layer 1152; a capping layer 1154; side shields 1170, insulating layers 1168, and 1174; and an electrical terminal 1166. Each of these layers may perform the same or similar functions as corresponding layers in other implementations described herein. A current generation source 1129 supplies a spin-polarized current to the lower shield 1126. A voltage sensing loop 1131 detects a voltage difference across the free layer 1152. Other aspects of the MR sensor 1100 not explicitly shown or described may be the same or similar to other MR sensors included herein.

It may be noted that in the implementation shown in FIGS. 1-3, the electrical terminal is formed on a side of the spin conductor that is opposite that illustrated in FIGS. 7-11. In one such implementation, material of the spin conductor layer and free layer is removed (e.g., milled or etched away) in a back portion of the MR sensor. The electrical terminal is formed adjacent in the back portion of the MR sensor so that a lower side of the electrical terminal contacts the spin conductor. Isolating material is then deposited over the electrical terminal to isolate the electrical terminal from the free layer and an upper shielding structure (e.g., material of an isolation layer 258, as shown in FIG. 2).

Figure 12:
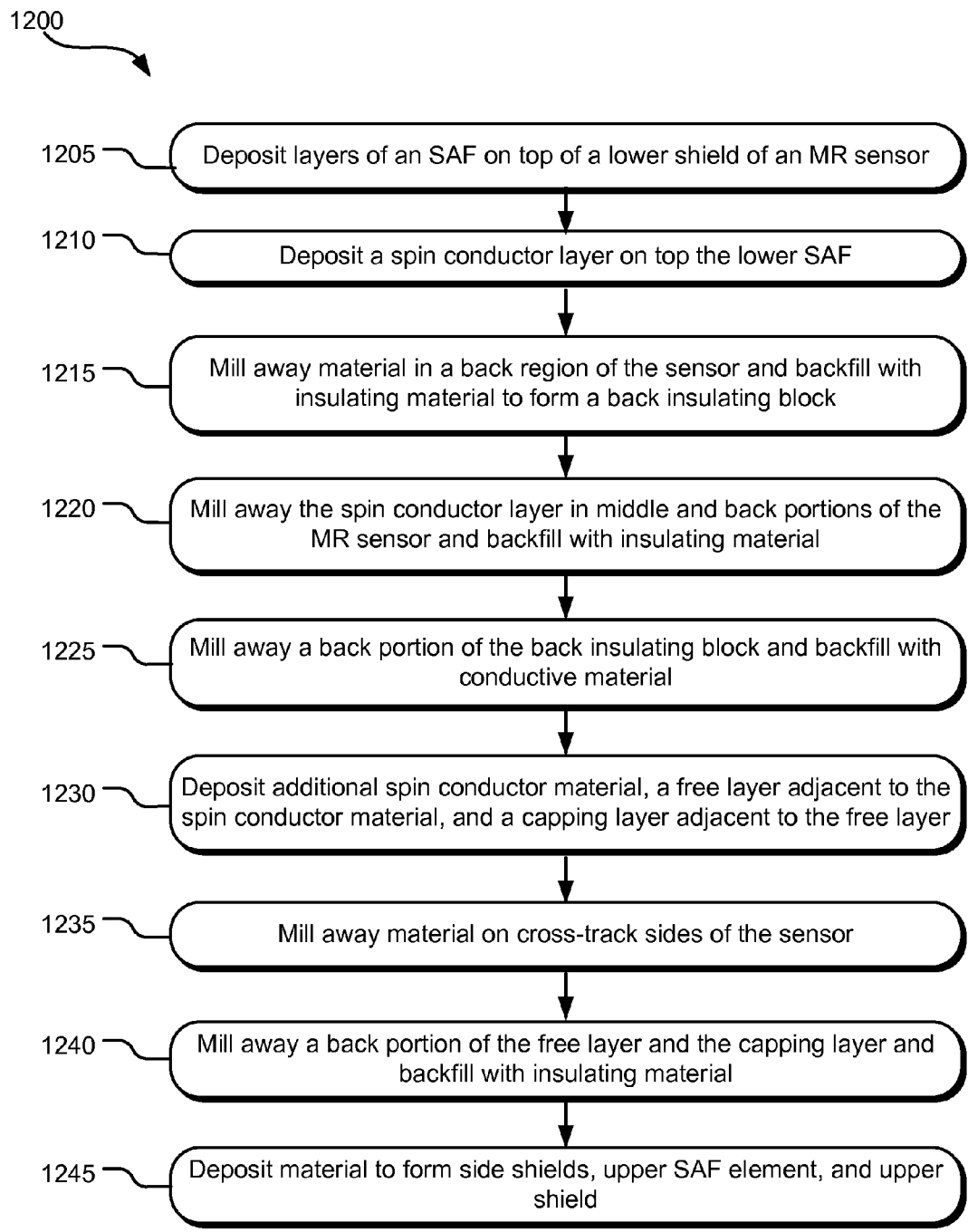
FIG. 12 illustrates example operations for manufacturing an example MR sensor.

FIG. 12 illustrates example operations 1200 for forming an example MR sensor. A deposition operation 1205 deposits multiple layers of material to form a lower portion of the MR sensor. In one implementation, the following layers are deposited in the following order: a lower shield layer, an AFM seed layer, an AFM layer, a pinned layer, a spacer coupling layer, and a reference layer. The pinned layer, spacer coupling layer, and reference layer together form a SAF structure that is adjacent to the lower shield layer.

Another deposition operation 1210 deposits a spin conductor layer directly adjacent the lower structure. A milling and backfill operation 1215 mills away material from a back portion of the MR sensor and backfills the milled area with an insulating material, such as aluminum-oxide, forming a back insulator block. A noble cap layer may be deposited on top of the MR sensor on top of both of the spin conductor layer and back insulating block to protect portions of the MR sensor during a CMP planarization process.

Another milling and backfill operation 1220 mills away material of the spin conductor layer and noble metal cap in middle and back portions of the MR sensor. A thin insulator layer is backfilled into the area where the material is removed (e.g., as illustrated by the thin insulator layer 560 in FIG. 5).

Yet another milling and backfill operation 1225 mills away a back portion of the MR sensor, removing material of the back insulating block. The area where the insulating layer is removed is backfilled with a metal material that serves as an electrical terminal. After the electrical terminal is formed, the MR sensor may undergo another CMP planarization process.

A deposition operation 1230 deposits additional layers on the MR sensor. The deposition operation 1230 deposits additional conductive material on the spin conductor layer, and also deposits soft magnetic material of a free layer adjacent to the spin conductor layer. Additionally, the deposition operation 1230 deposits one or more capping layers on top of and adjacent to the free layer.

Another milling and backfill operation 1235 mills away material on the sides of the MR sensor in the cross-track direction. A thin isolation layer is deposited across the MR sensor, and side shield material is deposited on top of the isolation layer. The MR sensor may undergo another CMP process to smooth the upper surface.

Another milling and backfill operation 1240 mills away a back portion of the free layer and capping layer. The back portion is backfilled with additional insulating material (e.g., insulating material 972 as illustrated in FIG. 9B). Material of the spin conductor layer may also be milled away in the back portion of the MR sensor and backfilled with an insulating material (e.g., as shown in FIG. 10B). In the meantime, material is removed from the side shields and replaced with insulating material (e.g., as illustrated in FIG. 9A and FIG. 10A).

Another deposition operation 1245 deposits layers of an upper SAF on the MR sensor, the SAF including a reference layer, a spacer coupling layer, and a pinned layer. The deposition operation 1245 also deposits an AFM layer adjacent to the pinned layer and an upper shield layer adjacent to the AFM layer. Other implementations may include other layers in addition to or in place of those described herein.

Although one or more of the example operations 1200 (described above) refer specifically to "milling," other implementations employ chemical or mechanical etching processes instead of, or in addition to, milling.

The above specification, examples, and data provide a complete description of the structure and use of exemplary implementations of the technology. Since many implementations of the technology can be made without departing from the spirit and scope of the technology, the invention resides in the claims hereinafter appended. Furthermore, structural features of the different implementations may be combined in yet another implementation without departing from the recited claims.

What is claimed is:

1. A magnetoresistive (MR) sensor comprising:
a synthetic antiferromagnet (SAF) that extends to an air bearing surface (ABS) of the MR sensor and provides a current path for a spin-polarized current through an ABS-region of a spin conductor layer.

2. The MR sensor of claim 1, wherein the spin conductor layer conducts spin-polarized current to an adjacent free layer.

3. The MR sensor of claim 2, wherein the spin current can travel between the SAF and the free layer by moving in a direction parallel to the ABS.

4. The MR sensor of claim 1, wherein a current source and the SAF structure provides a spin-polarized current.

5. The MR sensor of claim 1, wherein a current density within the MR sensor is greater in an area of a free layer proximal to an ABS than in an area of the free layer distal to the ABS.

6. The MR sensor of claim 1, further comprising:
a non-magnetic insulating layer between the SAF and the spin conductor layer that is recessed from the ABS.

7. The MR sensor of claim 1, further comprising:
a current source that applies a current to a lower shield; and
an electrical ground coupled to the spin conductor layer.

8. The MR sensor of claim 7, further comprising:
a voltage sensing loop electrically coupled to the electrical ground and an upper shield.

9. The MR sensor of claim 1, further comprising:
an electrical contact adjacent to the spin conductor layer and separated from a free layer by an insulator.

10. The MR sensor of claim 9, wherein the insulator prevents electrical conduction between the electrical contact and an upper shield.

11. A method comprising:
forming a synthetic antiferromagnet (SAF) structure in an MR sensor that extends to an air-bearing surface (ABS)

of the MR sensor and provides a current path for a spin-polarized current through an ABS-region of a spin conductor layer.

12. The method of claim 11, wherein the spin conductor layer conducts spin current to an adjacent free layer.

13. The method of claim 12, wherein the spin-polarized current can travel between the SAF and the free layer by moving only in a direction parallel to the ABS.

14. The method of claim 11, wherein the current source provides a spin-polarized current.

15. The method of claim 11, wherein a current density within the MR sensor is greater in an area of a free layer proximal to the ABS than in an area of the free layer distal to the ABS.

16. The method of claim 11, further comprising:
forming an insulating layer between the SAF and the spin conductor layer, the insulating layer recessed from the ABS.

17. A hard drive disk assembly comprising:
a magnetic media; and
an MR sensor including a synthetic antiferromagnet (SAF) extending to an air-bearing surface (ABS) of the MR sensor adjacent the magnetic media and providing a current path for a spin-polarized current through an ABS-region of a spin conductor layer.

18. The hard drive disk assembly of claim 17, wherein the spin conductor layer conducts spin-polarized current to an adjacent free layer.

19. The hard drive disk assembly of claim 18, wherein the spin-polarized current travels between the SAF and the free layer by moving only in a direction parallel to the ABS.

20. The hard drive disk assembly of claim 17, wherein a current density within the MR sensor is greater in an area of a free layer proximal to an air-bearing surface (ABS) than in an area of the free layer distal to the ABS.

* * * * *